(12) United States Patent
Bertin et al.

(10) Patent No.: US 8,580,586 B2
(45) Date of Patent: Nov. 12, 2013

(54) MEMORY ARRAYS USING NANOTUBE ARTICLES WITH REPROGRAMMABLE RESISTANCE

(75) Inventors: Claude L. Bertin, Venice, FL (US);
Frank Guo, Danville, CA (US);
Thomas Rueckes, Rockport, MA (US);
Steven L. Konsek, Boston, MA (US);
Mitchell Meinhold, Arlington, MA (US); Max Strasburg, Gresham, OR (US); Ramesh Sivarajan, Shrewsbury, MA (US); X. M. Henry Huang, Woburn, MA (US)

(73) Assignee: Nantero Inc., Woburn, MA (US)

( * ) Notice: Subject to any disclaimer, the term of this patent is extended or adjusted under 35 U.S.C. 154(b) by 608 days.

(21) Appl. No.: 12/354,102

(22) Filed: Jan. 15, 2009

(65) Prior Publication Data

US 2009/0154218 A1    Jun. 18, 2009

Related U.S. Application Data

(63) Continuation of application No. 11/274,967, filed on Nov. 15, 2005, now Pat. No. 7,479,654.

(60) Provisional application No. 60/679,029, filed on May 9, 2005, provisional application No. 60/692,765, filed on Jun. 22, 2005, provisional application No. 60/692,918, filed on Jun. 22, 2005, provisional application No. 60/692,891, filed on Jun. 22, 2005.

(51) Int. Cl.
*H01L 21/00* (2006.01)

(52) U.S. Cl.
USPC ............... 438/10; 438/3; 438/132; 438/238; 365/46; 365/100; 365/148; 977/720; 977/721; 977/722; 977/723; 977/742; 977/932; 977/943

(58) Field of Classification Search
USPC .......... 438/3, 10, 132, 238; 365/46, 100, 148; 977/720–723, 742, 932, 943
See application file for complete search history.

(56) References Cited

U.S. PATENT DOCUMENTS

| 3,448,302 A | 6/1969 | Shanefield |
| 4,646,266 A | 2/1987 | Ovshinsky et al. |

(Continued)

FOREIGN PATENT DOCUMENTS

| GB | 2364933 | 2/2002 |
| WO | WO-00/48195 | 8/2000 |

(Continued)

OTHER PUBLICATIONS

Extended European Search Report and Opinion for corresponding European Patent Application No. 06770130 mailed Nov. 6, 2009.

(Continued)

*Primary Examiner* — Bac Au
(74) *Attorney, Agent, or Firm* — Nantero Inc.

(57) ABSTRACT

A memory array includes a plurality of memory cells, each of which receives a bit line, a first word line, and a second word line. Each memory cell includes a cell selection circuit, which allows the memory cell to be selected. Each memory cell also includes a two-terminal switching device, which includes first and second conductive terminals in electrical communication with a nanotube article. The memory array also includes a memory operation circuit, which is operably coupled to the bit line, the first word line, and the second word line of each cell. The circuit can select the cell by activating an appropriate line, and can apply appropriate electrical stimuli to an appropriate line to reprogrammably change the relative resistance of the nanotube article between the first and second terminals. The relative resistance corresponds to an informational state of the memory cell.

18 Claims, 5 Drawing Sheets

(56) References Cited

U.S. PATENT DOCUMENTS

| | | |
|---|---|---|
| 4,743,569 A | 5/1988 | Plumton et al. |
| 4,809,225 A | 2/1989 | Dimmler et al. |
| 4,845,533 A | 7/1989 | Pryor et al. |
| 4,853,893 A | 8/1989 | Eaton, Jr. et al. |
| 4,876,667 A | 10/1989 | Ross et al. |
| 4,888,630 A | 12/1989 | Paterson |
| 4,979,149 A | 12/1990 | Popovic et al. |
| 5,005,158 A | 4/1991 | McClure et al. |
| 5,096,849 A | 3/1992 | Beilstein, Jr. et al. |
| 5,198,994 A | 3/1993 | Natori et al. |
| 5,311,039 A | 5/1994 | Kimura et al. |
| 5,414,654 A | 5/1995 | Kubota et al. |
| 5,416,737 A | 5/1995 | Lingstaedt et al. |
| 5,434,811 A | 7/1995 | Evans, Jr. et al. |
| 5,578,976 A | 11/1996 | Yao |
| 5,677,823 A | 10/1997 | Smith et al. |
| 5,682,345 A | 10/1997 | Roohparvar et al. |
| 5,698,175 A | 12/1997 | Hiura et al. |
| 5,768,196 A | 6/1998 | Bloker et al. |
| 5,818,748 A | 10/1998 | Bertin et al. |
| 5,818,749 A | 10/1998 | Harshfield |
| 5,834,818 A | 11/1998 | Beilstein, Jr. et al. |
| 5,903,010 A | 5/1999 | Flory et al. |
| 5,912,937 A | 6/1999 | Goetting et al. |
| 5,920,101 A | 7/1999 | Beilstein, Jr. et al. |
| 5,986,962 A | 11/1999 | Bertin et al. |
| 6,020,747 A | 2/2000 | Bahns et al. |
| 6,044,008 A | 3/2000 | Choi et al. |
| 6,048,740 A | 4/2000 | Hsu et al. |
| 6,057,637 A | 5/2000 | Zettl et al. |
| 6,084,053 A | 7/2000 | Matsubara et al. |
| 6,097,241 A | 8/2000 | Bertin et al. |
| 6,097,243 A | 8/2000 | Bertin et al. |
| 6,128,214 A | 10/2000 | Kuekes et al. |
| 6,136,160 A | 10/2000 | Hrkut et al. |
| 6,141,245 A | 10/2000 | Bertin et al. |
| 6,159,620 A | 12/2000 | Heath et al. |
| 6,160,230 A | 12/2000 | McMillan et al. |
| 6,183,714 B1 | 2/2001 | Smalley et al. |
| 6,187,823 B1 | 2/2001 | Haddon et al. |
| 6,198,655 B1 | 3/2001 | Heath et al. |
| 6,219,215 B1 | 4/2001 | Bertin et al. |
| 6,221,330 B1 | 4/2001 | Moy et al. |
| 6,232,706 B1 | 5/2001 | Dai et al. |
| 6,243,283 B1 | 6/2001 | Bertin et al. |
| 6,256,767 B1 | 7/2001 | Kuekes et al. |
| 6,277,318 B1 | 8/2001 | Bower et al. |
| 6,314,019 B1 | 11/2001 | Kuekes et al. |
| 6,331,262 B1 | 12/2001 | Haddon et al. |
| 6,342,276 B1 | 1/2002 | You |
| 6,345,362 B1 | 2/2002 | Bertin et al. |
| 6,346,846 B1 | 2/2002 | Bertin et al. |
| 6,348,700 B1 | 2/2002 | Ellenbogen et al. |
| 6,353,552 B2 | 3/2002 | Sample et al. |
| 6,368,569 B1 | 4/2002 | Haddon et al. |
| 6,373,771 B1 | 4/2002 | Fifield et al. |
| 6,376,787 B1 | 4/2002 | Martin et al. |
| 6,409,567 B1 | 6/2002 | Amey, Jr. et al. |
| 6,422,450 B1 | 7/2002 | Zhou et al. |
| 6,423,583 B1 | 7/2002 | Avouris et al. |
| 6,426,687 B1 | 7/2002 | Osborn |
| 6,430,511 B1 | 8/2002 | Tour et al. |
| 6,434,362 B1 | 8/2002 | Schier |
| 6,445,006 B1 | 9/2002 | Brandes et al. |
| 6,459,095 B1 | 10/2002 | Heath et al. |
| 6,462,977 B2 | 10/2002 | Butz |
| 6,465,813 B2 | 10/2002 | Ihm et al. |
| 6,493,272 B1 | 12/2002 | Fujii et al. |
| 6,495,116 B1 | 12/2002 | Herman |
| 6,495,258 B1 | 12/2002 | Chen et al. |
| 6,515,325 B1 | 2/2003 | Farnworth et al. |
| 6,515,339 B2 | 2/2003 | Shin et al. |
| 6,518,156 B1 | 2/2003 | Chen et al. |
| 6,528,020 B1 | 3/2003 | Dai et al. |
| 6,531,513 B2 | 3/2003 | Haddon et al. |
| 6,548,841 B2 | 4/2003 | Frazier et al. |
| 6,559,468 B1 | 5/2003 | Kuekes et al. |
| 6,569,595 B1 | 5/2003 | Sato et al. |
| 6,574,130 B2 | 6/2003 | Segal et al. |
| 6,587,408 B1 | 7/2003 | Jacobson et al. |
| 6,597,048 B1 | 7/2003 | Kan |
| 6,625,047 B2 | 9/2003 | Coleman, Jr. |
| 6,625,740 B1 | 9/2003 | Datar et al. |
| 6,627,689 B2 | 9/2003 | Iino |
| 6,630,772 B1 | 10/2003 | Bower et al. |
| 6,636,433 B2 | 10/2003 | Tanikawa |
| 6,641,793 B2 | 11/2003 | Haddon et al. |
| 6,643,165 B2 | 11/2003 | Segal et al. |
| 6,645,628 B2 | 11/2003 | Shiffler, Jr. et al. |
| 6,658,634 B1 | 12/2003 | Goodnow et al. |
| 6,661,270 B2 | 12/2003 | Nagata et al. |
| 6,673,424 B1 | 1/2004 | Lindsay et al. |
| 6,683,783 B1 | 1/2004 | Smalley et al. |
| 6,706,402 B2 | 3/2004 | Rueckes et al. |
| 6,706,566 B2 | 3/2004 | Avouris et al. |
| 6,707,098 B2 | 3/2004 | Hofmann et al. |
| 6,723,299 B1 | 4/2004 | Chen et al. |
| 6,740,910 B2 | 5/2004 | Roesner et al. |
| 6,741,334 B2 | 5/2004 | Asano et al. |
| 6,750,471 B2 | 6/2004 | Bethune et al. |
| 6,752,977 B2 | 6/2004 | Smalley et al. |
| 6,759,693 B2 | 7/2004 | Vogeli et al. |
| 6,760,245 B2 | 7/2004 | Eaton, Jr. et al. |
| 6,774,052 B2 | 8/2004 | Vogeli et al. |
| 6,781,166 B2 | 8/2004 | Lieber et al. |
| 6,784,028 B2 | 8/2004 | Rueckes et al. |
| 6,794,914 B2 | 9/2004 | Sani et al. |
| 6,795,338 B2 | 9/2004 | Parkinson et al. |
| 6,803,260 B2 | 10/2004 | Shin et al. |
| 6,803,840 B2 | 10/2004 | Hunt et al. |
| 6,808,746 B1 | 10/2004 | Dai et al. |
| 6,809,462 B2 | 10/2004 | Pelrine et al. |
| 6,809,465 B2 | 10/2004 | Jin |
| 6,833,558 B2 | 12/2004 | Lee et al. |
| 6,835,591 B2 | 12/2004 | Rueckes et al. |
| 6,835,613 B2 | 12/2004 | Schlaf |
| 6,836,424 B2 | 12/2004 | Segal et al. |
| 6,858,197 B1 | 2/2005 | Delzeit |
| 6,862,226 B2 | 3/2005 | Toyoda et al. |
| 6,863,942 B2 | 3/2005 | Ren et al. |
| 6,884,734 B2 | 4/2005 | Buehrer et al. |
| 6,888,773 B2 | 5/2005 | Morimoto |
| 6,890,780 B2 | 5/2005 | Lee |
| 6,894,359 B2 | 5/2005 | Bradley et al. |
| 6,896,864 B2 | 5/2005 | Clarke |
| 6,899,945 B2 | 5/2005 | Smalley et al. |
| 6,905,892 B2 | 6/2005 | Esmark et al. |
| 6,911,682 B2 | 6/2005 | Rueckes et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,944,054 B2 | 9/2005 | Rueckes et al. |
| 6,955,937 B1 | 10/2005 | Burke et al. |
| 6,968,486 B2 | 11/2005 | Matsushima et al. |
| 6,969,651 B1 | 11/2005 | Lu et al. |
| 6,982,903 B2 | 1/2006 | Bertin et al. |
| 6,986,962 B2 | 1/2006 | Oyanagi et al. |
| 6,990,009 B2 | 1/2006 | Bertin et al. |
| 6,995,649 B2 | 2/2006 | Nugent |
| 7,015,500 B2 | 3/2006 | Choi et al. |
| 7,054,194 B2 | 5/2006 | Liaw et al. |
| 7,075,141 B2 | 7/2006 | Rueckes et al. |
| 7,115,901 B2 | 10/2006 | Bertin et al. |
| 7,115,960 B2 | 10/2006 | Bertin et al. |
| 7,161,403 B2 | 1/2007 | Bertin |
| 7,667,999 B2 | 2/2010 | Herner et al. |
| 7,982,209 B2 | 7/2011 | Herner et al. |
| 2001/0004979 A1 | 6/2001 | Han et al. |
| 2001/0010656 A1 | 8/2001 | Mattison |
| 2001/0023986 A1 | 9/2001 | Mancevski |
| 2002/0081380 A1 | 6/2002 | Dillon et al. |
| 2002/0130311 A1 | 9/2002 | Lieber et al. |

(56) References Cited

U.S. PATENT DOCUMENTS

| | | |
|---|---|---|
| 2002/0130353 A1 | 9/2002 | Lieber |
| 2002/0160111 A1 | 10/2002 | Sun et al. |
| 2002/0163079 A1 | 11/2002 | Awano |
| 2002/0173083 A1 | 11/2002 | Avouris et al. |
| 2002/0175390 A1 | 11/2002 | Goldstein et al. |
| 2002/0179434 A1 | 12/2002 | Dai et al. |
| 2003/0004058 A1 | 1/2003 | Li et al. |
| 2003/0018630 A1 | 1/2003 | Indeck et al. |
| 2003/0021141 A1 | 1/2003 | Segal et al. |
| 2003/0021966 A1 | 1/2003 | Segal et al. |
| 2003/0022428 A1 | 1/2003 | Segal et al. |
| 2003/0065206 A1 | 4/2003 | Bolskar et al. |
| 2003/0122111 A1 | 7/2003 | Glatkowski |
| 2003/0124325 A1 | 7/2003 | Rueckes et al. |
| 2003/0124837 A1 | 7/2003 | Rueckes et al. |
| 2003/0129471 A1 | 7/2003 | Kitade et al. |
| 2003/0132823 A1 | 7/2003 | Hyman et al. |
| 2003/0148161 A1 | 8/2003 | Nuber et al. |
| 2003/0148562 A1 | 8/2003 | Luyken et al. |
| 2003/0165074 A1 | 9/2003 | Segal et al. |
| 2003/0170930 A1 | 9/2003 | Choi et al. |
| 2003/0177450 A1 | 9/2003 | Nugent |
| 2003/0178617 A1 | 9/2003 | Appenzeller et al. |
| 2003/0180472 A1 | 9/2003 | Zhou et al. |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2003/0220518 A1 | 11/2003 | Bolskar et al. |
| 2003/0234407 A1 | 12/2003 | Vogeli et al. |
| 2003/0236000 A1 | 12/2003 | Vogeli et al. |
| 2004/0001373 A1 | 1/2004 | Liaw et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0023514 A1 | 2/2004 | Moriya et al. |
| 2004/0027889 A1 | 2/2004 | Occhipinti et al. |
| 2004/0031975 A1 | 2/2004 | Kern et al. |
| 2004/0034177 A1 | 2/2004 | Chen |
| 2004/0041154 A1 | 3/2004 | Watanabe et al. |
| 2004/0043148 A1 | 3/2004 | Wei et al. |
| 2004/0043527 A1 | 3/2004 | Bradley et al. |
| 2004/0067602 A1 | 4/2004 | Jin |
| 2004/0071949 A1 | 4/2004 | Glatkowski et al. |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0095837 A1 | 5/2004 | Choi et al. |
| 2004/0099438 A1 | 5/2004 | Arthur et al. |
| 2004/0104129 A1 | 6/2004 | Gu et al. |
| 2004/0119127 A1* | 6/2004 | Anazawa et al. ............. 257/428 |
| 2004/0132070 A1 | 7/2004 | Star et al. |
| 2004/0159833 A1 | 8/2004 | Rueckes et al. |
| 2004/0164289 A1 | 8/2004 | Rueckes et al. |
| 2004/0164327 A1 | 8/2004 | Shin et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0198030 A1 | 10/2004 | Buehrer et al. |
| 2004/0214041 A1 | 10/2004 | Lu et al. |
| 2004/0214366 A1 | 10/2004 | Segal et al. |
| 2004/0214367 A1 | 10/2004 | Segal et al. |
| 2004/0238887 A1 | 12/2004 | Nihey |
| 2004/0238907 A1 | 12/2004 | Pinkerton et al. |
| 2004/0247896 A1 | 12/2004 | Apen et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0007002 A1 | 1/2005 | Golovchenko et al. |
| 2005/0011272 A1 | 1/2005 | Tenerz |
| 2005/0028515 A1 | 2/2005 | Fukuma et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0040874 A1 | 2/2005 | Allison et al. |
| 2005/0041465 A1 | 2/2005 | Rueckes et al. |
| 2005/0041466 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 | 3/2005 | Bertin et al. |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065741 A1 | 3/2005 | Segal et al. |
| 2005/0068128 A1 | 3/2005 | Yip |
| 2005/0074926 A1 | 4/2005 | Bertin et al. |
| 2005/0079659 A1 | 4/2005 | Duan et al. |
| 2005/0095938 A1 | 5/2005 | Rosenberger et al. |
| 2005/0101112 A1 | 5/2005 | Rueckes et al. |
| 2005/0128788 A1 | 6/2005 | Segal et al. |
| 2005/0139902 A1 | 6/2005 | Jung |
| 2005/0141266 A1 | 6/2005 | Jung |
| 2005/0141272 A1 | 6/2005 | Jung |
| 2005/0162896 A1 | 7/2005 | Jung |
| 2005/0174842 A1 | 8/2005 | Bertin et al. |
| 2005/0179029 A1 | 8/2005 | Furukawa et al. |
| 2005/0191495 A1 | 9/2005 | Rueckes et al. |
| 2005/0212014 A1 | 9/2005 | Horibe et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Bertin |
| 2005/0282516 A1 | 12/2005 | Bertin |
| 2006/0044035 A1 | 3/2006 | Bertin |
| 2006/0052509 A1 | 3/2006 | Saitoh |
| 2006/0054922 A1 | 3/2006 | Pettit |
| 2006/0061389 A1 | 3/2006 | Bertin |
| 2006/0115640 A1 | 6/2006 | Yodh et al. |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0213251 A1* | 9/2006 | Rinzler et al. ................. 73/23.2 |
| 2006/0231865 A1 | 10/2006 | Rueckes et al. |
| 2006/0237537 A1 | 10/2006 | Empedocles |
| 2006/0237805 A1 | 10/2006 | Segal et al. |
| 2006/0237857 A1 | 10/2006 | Bertin et al. |
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0258122 A1 | 11/2006 | Whitefield et al. |
| 2006/0264053 A1 | 11/2006 | Yates |
| 2006/0276056 A1 | 12/2006 | Ward et al. |
| 2006/0281256 A1 | 12/2006 | Carter et al. |
| 2006/0281287 A1 | 12/2006 | Yates et al. |
| 2006/0292716 A1 | 12/2006 | Gu et al. |
| 2007/0004191 A1 | 1/2007 | Gu et al. |
| 2007/0015303 A1 | 1/2007 | Bertin et al. |
| 2008/0012047 A1 | 1/2008 | Bertin et al. |
| 2008/0142850 A1 | 6/2008 | Bertin et al. |
| 2008/0157126 A1 | 7/2008 | Bertin et al. |
| 2008/0159042 A1 | 7/2008 | Bertin et al. |
| 2009/0166609 A1 | 7/2009 | Schricker et al. |
| 2009/0166610 A1 | 7/2009 | Schricker et al. |
| 2009/0168491 A1 | 7/2009 | Schricker et al. |

(56) References Cited

U.S. PATENT DOCUMENTS

FOREIGN PATENT DOCUMENTS

| WO | WO-01/03208 A1 | 1/2001 |
|---|---|---|
| WO | WO-01/44796 A1 | 6/2001 |
| WO | WO-03/071015 | 8/2003 |
| WO | WO-03/091486 | 11/2003 |
| WO | WO-2004/065655 | 8/2004 |
| WO | WO-2004/065657 | 8/2004 |
| WO | WO-2004/065671 | 8/2004 |
| WO | WO-2006/122111 A2 | 11/2006 |

OTHER PUBLICATIONS

Avouris, P., "Carbon nanotube electronics," Chemical Physics 2002, vol. 281, pp. 429-445.
Kinaret, J. M. et al "A Carbon-nanotube-based nanorelay," *Applied Physics Letters*, Feb. 24, 2003, vol. 82, No. 8, pp. 1287-1289.
Martel, R., et al, "Carbon Nanotube Field-Effect Transistors and Logic Circuits," *DAC 2002*, Jun. 10-12, 2002, vol. 7.4, pp. 94-98.
Radosavljevic, M. et al., "Nonvolatile molecular memory elements based on ambipolar nanotube field effect transistors," Nano Letters, 2002, vol. 2(7), 761-764.
Rueckes, T., et al., "Carbon Nanotube-Based Nonvolatile Random Access Memory for Molecular Computing", Science, vol. 289, Issue 5476, Jul. 7, 2000, pp. 94-97.
Bachtold, A. et al., "Logic Circuits with Carbon Nanotube Transistors", Science, 2001. 294, 1317-1320.
Derycke, V. et al. "Carbon Nanotube Inter-and Intramolecular Logic Gates." Nano Letters, vol. 1, pp. 453-456, Sep. 2001.
Derycke, V., "Controlling Doping and Carrier Injection in Carbon NanotubeTransistors", Applied Physics Letters, 2002. 80 (15) 2773-2775.
Duan, Xiangfeng, Nonvolatile Memory and Programmable Logic from Molecule-Gated Nanowires, Nano Letters, Mar. 2002, pp. 1-4.
Heinze, S., "Carbon Nanotubes as Schottky Barrier Transistors," Physical Review Letters, vol. 89, No. 10, pp. 106801-1-106801-4, Sep. 2, 2002.
Javey, Ali et al., "Carbon Nanotube Transistor Arrays for Multistage Complementary Logic and Ring Oscillators", Nano Letters, 2002. 2 (9) 929-932.
Luyken, R.J. et al., "Concepts for hybrid CMOS-molecular non-volatile memories", Nanotechnology, 2003. 14, 273-276.
Wind, S. J., "Fabrication and Electrical Characterization of Top Gate Single-Wall Carbon Nanotube Field-Effect Transistors," IBM T. J. Watson Research Center, 14 pgs.
Chen, J. et al., "Self-aligned carbon nanotube transistors with charge transfer doping", *Applied Physics Letters*, vol. 86, pp. 123108-1-123108-3, 2005.
Chen, J. et al., "Self-aligned Carbon Nanotube Transistors with Novel Chemical Doping", *IEDM*, pp. 29.4.1-29.4.4, 2004.
Huang, Y., et al "Logic Gates and Computation from Assembled Nanowire Building Blocks," *Science*, Nov. 9, 2001, vol. 294, pp. 1313-1316.
Javey, A. et al., "Carbon Nanotube Field-Effect Transistors with Integrated Ohmic Contacts and High-k Gate Dielectrics", *Nano Letters*, vol. 4, No. 3, pp. 447-450, 2004.
Javey, A. et al., "High-k dielectrics for advanced carbon-nanotube transistors and logic gates", *Nature Materials*, vol. 1, pp. 241-246, Dec. 2002.
Lin, Y.M. et al., "Novel Carbon Nanotube FET Design with Tunable Polarity", *IEDM*, pp. 29.2.1-29.2.4, 2004.
Wind, S. J. et al., "Vertical scaling of carbon nanotube field-effect transistors using top gate electrodes", *Applied Physics Letters*, vol. 80, No. 20, pp. 3817-3819, May 20, 2002.
Collins, et al., Engineering Carbon Nanotubes and Nanotube Circuits Using Electrical Breakdown, Science, vol. 292, pp. 706-709, Apr. 2001.
Onoa, G.B. et al., "Bulk production of singly dispersed carbon nanotubes with prescribed lengths," Nanotechnology, vol. 16, pp. 2799-2803, 2005.
Hone, James. "Phonons and Thermal Properties of Carbon Nanotubes." Topics of Applied Physics (2001); 80, 273-286.
Kong, Jing et al. "Quantum Interference and Ballistic Transmission in Nanotube Electron Waveguides." Physical Review Letters (Sep. 3, 2001); 87, 106801(4).
Johnson, R. Colin, "IBM Fellow Unrolls Blueprint for Nano," EETimes Online, Mar. 6, 2006, 3 pages.
Langer, L. et al., "Electrical Resistance of a Carbon Nanotube Bundle," J. Mater. Res. vol. 9, No. 4, Apr. 1994, 6 pages.
U.S. Appl. No. 11/280,786, Bertin.
U.S. Appl. No. 11/835,583, Bertin.
U.S. Appl. No. 11/835,613, Bertin.
U.S. Appl. No. 11/835,651, Bertin.
Ami, S., et al., "Logic gates and memory cells based on single $C_{60}$ electromechanical transistors," *Nanotechnolgy*, 2001, vol. 12, pp. 44-52.
Bakoglu, Circuits Interconnections and Packaging for VLSI, Addison-Weslely Publishing Company, Inc., pp. 152, 412-416, 1990.
Bakoglu, Chapter 8, "Clocking of High-Speed Systems", Circuits Interconnections and Packaging for VLSI, Addison-Wesley Publishing Company, Inc., pp. 338-355, 1990.
Bardel, et al, "Built-In Test for VLSI: Pseudorandum Techniques", John Wiley & Sons, New York, NY 1987, pp. 38-43.
Batchtold, A., et al., "Logic circuits cased on carbon nanotubes," *Physica E*, 2003, vol. 16, pp. 42-46.
Bernholc et al., "Mechanical and electrical properties of nanotubes", *Ann. Rev. Mater. Res.*, vol. 32, p. 347, 2002.
Bradley, K. et al., "Flexible Nanotube Electronics," *Nano Letters*, vol. 3, No. 10, pp. 1353-1355, 2003.
Collier, C.P., et al.,"Electronically Confiurable Molecular-Based Logic Gates," *Science*, Jul. 16, 1999, vol. 285, pp. 391-394.
Cui, J.B. et al., "Carbon nanotube memory devices of high charge storage stability," Applied Physics Letters, vol. 81, No. 17, Oct. 21, 2002, pp. 3260-3262.
Dally, Bill, Low-Powerd Architecture, Standford University, Stream Processors, Inc., 2002.
Dally, William J., Computer Architecture is all about interconect, HPCA Panel, pp. 1-11, Feb. 4, 2002.
Dehon, A., "Array-Based Architecture for FET-Based, Nanoscale Electronics," *IEEE Transactinos on Nanotechnology*, 2003, vol. 2, No. 1, pp. 23-32.
Dequesnes, M. et al., "Calculation of pull-in voltages for carbon-nanotube-based nanoelectromechanical switches," *Nanotechnology*, Jan. 22, 2002, vol. 13, pp. 383-386.
Dequesnes, M. et al., "Simulation of carbon nanotube-based nanoelectromechanical switches", *Computational Nanoscience and Nanotechnology*, 2002, ISBN 0-9708275-6-3, pp. 383-386.
Franklin, N.R., et al., "Integration of suspended carbon nanotube arrays into electronic devices and electromechanical systems," *Appl. Phys. Lett.*, Jul. 29, 2002, vol. 81, No. 5, pp. 913-915.
Fuhrer, M.S., et al., "High-Mobility Nanotube Transistor Memory," *Nano Letters*, 2002, vol. 2, No. 7, pp. 755-759.
Fujiwara, "Logic Design and Design for Testability", MIT Press, Cambridge, Massachusetts, 1985, pp. 238, 256-259.
Hoenlein, W., et al., "Carbon nanotubes for microelectronics: status and future prospects," *Materials Science Engineering*, 2003, vol. 23, pp. 663-669.
International Search Report and Written Opinion of the International Searching Authority, the United States Patent and Trademark Office, for PCT/US2006/017902, 6 pages.
Novak, J.P. et al., "Nerve agent detection using networks of single-walled carbon nanotubes," Applied Physics Letters, Volumber 83, No. 19, Nov. 10, 2003, pp. 4026-4028.
Snow, E.S. et al., "Random networks of carbon nanotubes as an electronic material," Applied Physics Letters, vol. 82, No. 13, Mar. 31, 2003, pp. 2145-2147.
Srivastava, et al, "A Comparative Scaling Analysis of Metalllic and Carbon Nanotubes Interconnections for Nanometer Scale VLSI Technologies," *Proceedings of the 21st International VLSI Multilevel Interconnect Conference (VMIC)*, Sep. 29-Oct. 3, 2004, pp. 393-398.
Stadermann, M. et al., "Nanoscale study of conduction through carbon nanotube networks," *Phys. Rev. B 69*, 201402(R), 2004.

(56) References Cited

OTHER PUBLICATIONS

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Supplementary European Search Report and Written Opinion for European Application No. EP06770130, dated Oct. 29, 2009, 5 pages.

Tans, S.J., et al, "Room-temperature transistor based on a single carbon nanotube", *Nature*, May 1998, vol. 393, pp. 49-52.

Wang, D., "Revisiting the FO4 Metric," Real World Technologies, copyright 1996-2001, Updated Aug. 15, 2002, 9 pages.

Zhan, W. et al., "Microelectrochemical Logic Circuits", *J. Am. Chem. Soc.*, Jun. 12, 2003, vol. 125, pp. 9934-9935.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Awano, Y., "Graphene for VLSI: FET and Interconnect Applications," IEDM 2009 Technical Digest, pp. 10.1.1-10.1.4.

Brown, K. M., "System in package "The Rebirth of SIP"," 2004 IEEE Custom Integrated Circuits, May 2004, 6 pages.

Crowley, et al., "512 Mb PROM with 8 layers of antifuse/Diode cells," IEEE International Solid-State Circuits Conference, vol. XLVI, Feb. 2003, pp. 284-285.

Huai, Y., "Spin-Transfet Torque MRAM (STT-MTAM): Challenges and Prospects," AAPS Bulletin, vol. 18, No. 6, Dec. 2008, pp. 33-40.

Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.

Kianian, et al., "A 3D Stackable Carbon Nanotube-based Nonvolatile Memory (NRAM)," ESSDERC, Nantero Inc., Jun. 14, 2010, 4 pages.

Servalli, G., "A 45nm Generation Phase Change Memory Technology," IEDM 2009 Technical Digest, pp. 5.7.1-5.7.4.

Brock, et al., "Carbon Nanotube Memories and Fabric in a Radiation Hard Semiconductor Foundry," Aerospace Conference 2005 IEEE, Mar. 2005, 9 pages.

Rosendale, et al., "A 4 Megabit Carbon Nanotube-based Nonvolatile Memory (NRAM)," ESSCIRC, Seville, Spain, Sep. 2010, pp. 478-481.

Ward, et al., "A Nonvolatile Nanoelectromechanical Memory Element Utilizing a Fabric of Carbon Nanotubes," Nonvolatile Memory Tech. Symposium, Nov. 2004, Orlando, Florida, pp. 34-38.

\* cited by examiner

MEMORY ARRAYS USING NANOTUBE ARTICLES WITH REPROGRAMMABLE RESISTANCE

CROSS-REFERENCE TO RELATED APPLICATIONS

This application is a continuation of and claims priority under 35 U.S.C. §120 to U.S. patent application Ser. No. 11/274,967, filed on Nov. 15, 2005, entitled Memory Arrays Using Nanotube Articles with Reprogrammable Resistance, the entire contents of which are incorporated herein by reference.

This application claims priority under 35 U.S.C. §119(e) to the following applications, the contents of which are incorporated herein in their entirety by reference:

U.S. Provisional Patent Application No. 60/679,029, filed on May 9, 2005, entitled Reversible Nanoswitch;

U.S. Provisional Patent Application No. 60/692,891, filed on Jun. 22, 2005, entitled Reversible Nanoswitch;

U.S. Provisional Patent Application No. 60/692,765, filed on Jun. 22, 2005, entitled Embedded CNT Switch Applications for Logic; and U.S. Provisional Patent Application No. 60/692,918, filed on Jun. 22, 2005, entitled NRAM Nonsuspended Reversible Nanoswitch Nanotube Array.

This application is related to the following applications, the contents of which are incorporated herein in their entirety by reference:

U.S. patent application Ser. No. 11/280,786, filed on Nov. 15, 2005, entitled Two-Terminal Nanotube Devices and Systems And Methods Of Making Same;

U.S. patent application Ser. No. 11,280,599, filed on Nov. 15, 2005, entitled Non-Volatile Shadow Latch Using A Nanotube Switch;

U.S. patent application Ser. No. 10/810,962, filed on Mar. 28, 2003, entitled NRAM Bit Selectable Two-Device Nanotube Array;

U.S. patent application Ser. No. 10/811,191, filed on Mar. 26, 2004, entitled Four Terminal Non-Volatile Transistor Device;

U.S. patent application Ser. No. 10/811,373, filed on Mar. 26, 2004, entitled Nanotube-on-Gate FET Structures and Applications; and U.S. patent application Ser. No. 10/810,963, filed on Mar. 26, 2004, entitled Non-Volatile Ram Cell and Array Using Nanotube Switch Position for Information State.

BACKGROUND

1. Technical Field

The invention generally relates to nonvolatile random access memory arrays, and more specifically to nonvolatile random access memory arrays that use nanotube articles having re-programmable resistance to provide unit cells that may be employed in integrated circuits.

2. Discussion of Related Art

Important characteristics for a memory cell for use in a commercial electronic device are having a low production cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM has a relatively low cost but cannot be rewritten. PROM can be electrically programmed, but with only a single write cycle. EPROM has read cycles that are fast relative to ROM and PROM read cycles, but has relatively long erase times and is reliable for only a few iterative read/write cycles. EEPROM (or "Flash") is inexpensive to produce and has low power consumption, but has long write cycles (ms) and low relative speed in comparison to DRAM or SRAM. Flash also has a finite number of read/write cycles, which leads to low long-term reliability. ROM, PROM, EPROM and EEPROM are all non-volatile, meaning that if power to the memory is interrupted, the memory will retain the information stored in the memory cells.

DRAM stores charge on transistor gates that act as capacitors. These capacitors must be electrically refreshed every few milliseconds to compensate for charge leakage. Also, a read operation discharges the capacitors, so the information must subsequently be rewritten to the memory. This complicates the system design, because separate circuitry must be included to "refresh" the memory contents both before the capacitors discharge, and after a read operation. SRAM does not need to be refreshed, and is fast relative to DRAM, but has lower density and is more expensive relative to DRAM. Both SRAM and DRAM are volatile, meaning that if power to the memory is interrupted, the memory cells will lose their stored information.

Consequently, existing commercially available technologies are generally either nonvolatile, but not randomly accessible and have a low density, high production cost, and a limited ability to allow multiple writes with high reliability of the circuit's function; or are volatile, and have complicated system design or have a low density. Some emerging technologies have attempted to address these shortcomings.

For example, magnetic RAM (MRAM) or ferromagnetic RAM (FRAM) have nonvolatile memory cells that are generated from the orientation of a magnetic or ferromagnetic region of material. MRAM utilizes a magnetoresistive memory element, which is based on either the anisotropic magnetoresistance or giant magnetoresistance of ferromagnetic materials. Both of these types of memory cells are nonvolatile, but have a relatively high resistance and low density. A different proposed magnetic memory cell, based upon magnetic tunnel junctions, has also been examined but has not led to large-scale commercialized MRAM devices. FRAM uses a circuit architecture similar to DRAM, but instead utilizes a thin film ferroelectric capacitor and an externally applied electric field. This capacitor is believed to retain its electrical polarization after removing the externally applied electric field, yielding a nonvolatile memory cell. However FRAM memory cells tend to be large, and are difficult to manufacture as large-scale integrated components. See U.S. Pat. Nos. 4,853,893; 4,888,630; 5,198,994.

Another emerging nonvolatile memory technology is phase change memory. This technology stores information by inducing a structural phase change in thin-film alloys, which incorporate elements such as selenium or tellurium. These alloys are believed to remain stable in both crystalline and amorphous states, allowing the formation of a bi-stable switch that functions as a nonvolatile memory cell. This technology, however, appears to operate at a slow speed, to be difficult to manufacture, has unknown reliability, and has not reached a state of commercialization. See U.S. Pat. Nos. 3,448,302; 4,845,533; 4,876,667; 6,044,008.

Wire crossbar memory has also been proposed. See U.S. Pat. Nos. 6,128,214; 6,159,620; and 6,198,655. These proposed memory cells utilize molecules to build bi-stable switches. Two wires (which can be metal or semiconductor depending on the particular implementation) are crossed, with a layer of one or more molecular compounds sandwiched between the wires at the junction. By controlling the sandwiched compound(s), e.g. by chemical assembly or by electrochemical oxidation/reduction reactions, the two wires are brought into or out of electrical contact with each other to generate a respective "on" or "off" state. This form of memory cell has the manufacturing limitation of requiring highly specialized wire junctions. It also may not retain nonvolatility or long-term reliability owing to the inherent instability found in redox processes, and the risk of degradation of the chemical compound(s).

Recently, memory devices have been proposed which use nanoscopic wires, such as single-walled carbon nanotubes, to form crossbar junctions that serve as memory cells. See WO 01/03208, "Nanoscopic Wire-Based Devices, Arrays, and Methods of Their Manufacture;" and Thomas Rueckes et al., "Carbon Nanotube-Based Nonvolatile Random Access Memory for Molecular Computing," Science, vol. 289, pp. 94-97, 7 Jul., 2000. Hereinafter these devices are called nanotube wire crossbar memories (NTWCMs). In these proposed devices, individual single-walled nanotube wires are suspended over other wires, defining memory cells. Electrical signals that are written to one or both wires cause them to physically attract or repel relative to one another. Each physical state (i.e., attracted or repelled wires) corresponds to an electrical state. Repelled wires form an open circuit junction. Attracted wires form a closed state, forming a rectified junction. When electrical power is removed from the junction, the wires retain their physical (and thus electrical) state, thereby forming a nonvolatile memory cell.

More recently proposed nanotube ribbon crossbar memory (NTRCM) devices offer the advantages of being non-volatile, having a low production cost per bit, a high density, fast random access, and low power consumption, and also having a high degree of tolerance to radiation. The memory offers competitive performance to and achieves a higher density than conventional SRAM, because it utilizes a two-device structure having an electromechanically responsive nanotube plus 3 array lines to control and read the memory cell state. The memory offers the relative advantages of having a nondestructive read-out (NDRO) operation, and nonvolatility.

U.S. Pat. No. 6,919,592 discloses, among other things, NTRCM-based electromechanical circuits, such as memory cells. These circuits include a structure having supports extending from a surface of a substrate, and electrically conductive traces in between. The supports suspend nanotube ribbons across the electrically conductive traces. Each ribbon comprises one or more nanotubes. For example, as disclosed in U.S. Pat. No. 6,919,592, a fabric of nanotubes (nanofabric) may be patterned into ribbons. Then the ribbons can be used as components to create nonvolatile electromechanical memory cells. The ribbon is electromechanically deflectable in response to electrical stimulus of control traces and/or the ribbon. The deflected physical state of the ribbon may be made to represent a corresponding information state. The deflected physical state has nonvolatile properties, meaning the ribbon retains its physical (and therefore informational) state even if power to the memory cell is removed. As explained in U.S. Pat. No. 6,911,682, three-trace architectures may be used for electromechanical memory cells, in which the two of the traces are electrodes to control the deflection of the ribbon.

The ribbons may be formed, for example, as disclosed in U.S. Publication Pat. No. 6,919,592, by selectively removing material from a deposited or grown layer or matted fabric of nanotubes. To fabricate suspended nanotube ribbons, multiple masking steps may be used. Sacrificial layers may be fabricated both above and below the nanotube ribbons in the switching regions, where the ribbons will be suspended. The sacrificial layers may be subsequently removed in order to leave spaces above and below the ribbons, i.e. to suspend the ribbons.

An ideal memory device for at least some purposes is one that enables a simple, low cost integration for fabrication using existing bulk or SOI CMOS processes. Such a memory device could be fabricated with only one additional masking layer (or at most two additional masking layers) and a minimum number of additional process steps.

SUMMARY

The present invention provides nonvolatile memory arrays that include two-terminal nanotube switches. The arrays include a plurality of memory unit cells, each of which receives a bit line, a first word line, and a second word line. Each memory unit cell includes a cell selection transistor, and a non-volatile two-terminal nanotube article of reprogrammable resistance, the state of which determines the logical state of the memory unit cell.

Under one aspect, a memory array includes a plurality of memory cells, each memory cell receiving a bit line, a first word line, and a second word line. Each memory cell includes a cell selection circuit operably coupled to the first word line and the bit line to select the memory cell in response to activation of at lease one of the bit line and the first word line. Each memory cell also includes a two-terminal switching device, which includes first and second conductive terminals in electrical communication with a nanotube article. The first terminal is operably coupled to the cell selection circuit and the second terminal is operably coupled to the second word line. The memory array also includes a memory operation circuit operably coupled to the bit line, the first word line, and the second word line of each cell. The operation circuit is capable of selecting the cell by activating at least one of the bit line and the first word line and applying a first electrical stimulus to at least one of the bit line, first word line, and second word line to change the resistance of the nanotube article between the first and second terminals to a relatively high resistance. The operation circuit is also capable of selecting the cell by activating at least one of the bit line and the first word line applying a second electrical stimulus to at least one of the bit line, first word line, and second word line to change the resistance of the nanotube article between the first and second terminals to a relatively low resistance. A relatively high resistance of the nanotube article corresponds to a first informational state of the memory cell, and wherein a relatively low resistance of the nanotube article corresponds to a second informational state of the memory cell.

Under another aspect, the first and second informational states are nonvolatile. The resistance of the first state may be at least about ten times larger than the resistance of the second state.

Under another aspect, the cell selection circuit includes a transistor with a gate, a source, and a drain. The gate may be in electrical contact with the first word line, the source may be in electrical contact with the first conductive terminal, and the drain may be in electrical contact with the bit line. Under another aspect, the cell selection circuit includes a FET.

Under another aspect, the operation circuit reads an informational state of the memory cell by selecting the cell by activating one of the bit line and the first word line and applying a read stimulus to the other of the bit line and the first word line. The read stimulus may include applying a floating voltage, and the operation circuit may read the informational state of the cell by determining whether the voltage on the other of the bit line and the first word line decays below a threshold value. Reading the informational state of the memory cell may be a non-destructive read-out operation.

Under another aspect, the operation circuit includes a latch corresponding to each memory cell and records the informational state of the memory cell in the corresponding latch before erasing the memory cell.

Under another aspect, the operation circuit includes circuitry to produce an erase operation for the first electrical stimulus. The erase operation may include applying one or more voltage pulses, wherein an amplitude of the pulses, a waveform of the pulses, and a number of the pulses together are sufficient to change the device to the first state. Under another aspect, the operation circuit includes circuitry to produce a program operation for the second electrical stimulus. The program operation may include applying one or more voltage pulses, wherein an amplitude of the pulses, a waveform of the pulses, and a number of the pulses together are sufficient to change the device to the second state.

Under another aspect, a memory cell includes a cell selection circuit in electrical communication with a bit line and a first word line to select the memory cell in response to activation of at least one of the bit line and the first word line. The memory cell also includes a two-terminal nanotube switching device, which includes first and second conductive terminals in electrical communication with a nanotube article. The first terminal is in electrical communication with the cell selection circuit and the second terminal is in electrical communication with a second word line. Selecting the memory cell and applying a first electrical stimulus to at least one of the bit line, first word line, and second word line changes a resistance of the switching device between the first and second terminals from a relatively low resistance to a relatively high resistance. Selecting the memory cell and applying a second electrical stimulus to at least one of the bit line, first word line, and second word line changes a resistance of the switching device between the first and second terminals from a relatively high resistance to a relatively low resistance. The relatively high resistance between the first and second terminals corresponds to a first informational state of the memory cell, and the relatively low resistance between the first and second terminals corresponds to a second informational state of the memory cell.

Under another aspect, the first and second informational states are non-volatile. The resistance of the first informational state may be at least about ten times larger than the resistance of the second state.

Under another aspect, the cell selection circuit includes a transistor with a gate, a source, and a drain. The gate may be in electrical communication with the first word line, the source is in electrical communication with the first conductive terminal, and the drain is in electrical communication with the bit line. Under another aspect, the cell selection circuit comprises a FET.

Under another aspect, the first electrical stimulus includes applying one or more voltage pulses, wherein an amplitude of the pulses, a waveform of the pulses, and a number of the pulses together are sufficient to change the device to the first informational state. Under another aspect, the second electrical stimulus includes applying one or more voltage pulses, wherein an amplitude of the pulses, a waveform of the pulses, and a number of the pulses together are sufficient to change the device to the second informational state.

DETAILED DESCRIPTION

Preferred embodiments of the present invention provide scalable memory arrays that include nanotube articles with reprogrammable resistance. In general, the array includes a plurality of memory unit cells, each of which includes a cell selection transistor and a two-terminal nanotube switch, and is operably connected to a bit line, a first word line, and a second word line. The cell selection transistor is used to select the cell by applying an electrical stimulus to the transistor using the bit, first word, and/or the second word lines. The two-terminal nanotube switch is operably connected to the cell selection transistor, and is used to store the state of the memory unit cell. The two-terminal nanotube switch includes two conductive terminals and a nanotube element. The resistance between the two conductive terminals characterizes the state of the memory cell. A high resistance state can be used as a logic "0" state, and a low resistance state can be used as a logic "1" state. The cell can be reprogrammably switched between the two states by applying appropriate electrical stimuli to the bit, first word, and/or the second word lines.

One embodiment of a non-volatile nanotube memory component includes NFET or PFET, particularly NFET, array devices, in combination with nonvolatile two-terminal nanotube (NT) switches, to provide non-volatile unit cells that may be employed in integrated circuits.

Embodiments of two terminal nonvolatile NT switches that can be included in non-volatile unit cells are described in U.S. patent application Ser. No. 13/113,398, entitled "Two-Terminal Nanotube Devices and Systems and Methods of Making Same," filed on an even date herewith and having a common assignee as the present application, the contents of which are incorporated herein in their entirety by reference.

The nanotube switch components in the described embodiments may be fabricated by, e.g., depositing and patterning a metal layer in direct contact with nanotube ribbons. These nanotube switches may be used in memory devices that achieve memory densities that are at least as dense as DRAMs, and at the same time offer NDRO operation, non-volatile data retention, and fast random access read times. Further, write (program) and erase times may be faster, and require lower voltages, than those of EEPROM and Flash EEPROM.

Two Terminal Nanotube Switches

Embodiments of two-terminal nanotube switches that can be included in the described memory arrays are described in U.S. patent application Ser. No. 11/280,786, entitled "Two-Terminal Nanotube Devices And Systems And Methods Of Making Same," filed on an even date herewith and having a common assignee as the present application, the contents of which are incorporated herein in their entirety by reference. Associated structures using the switches, along with electrical characteristics, methods of fabricating, and methods of integrating the switches with existing semiconductor technology are described.

Figure 1A:
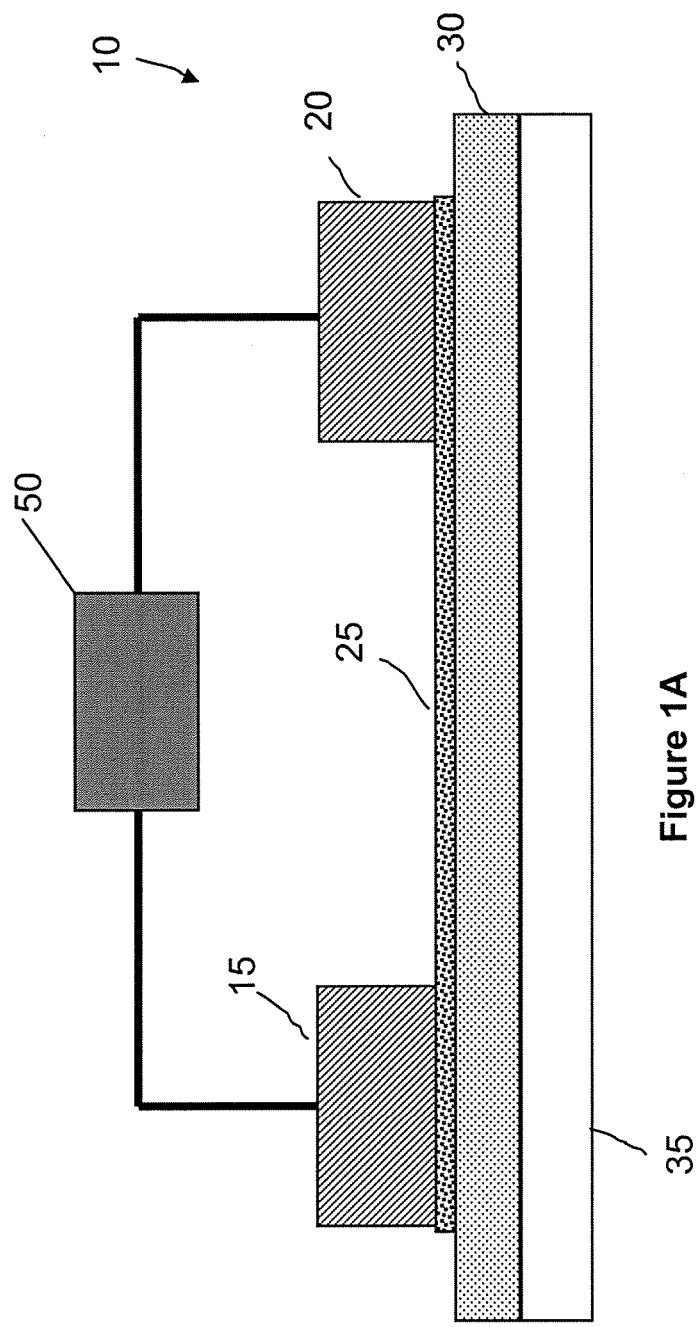
FIGS. 1A and 1B are cross-sectional representations of certain embodiments of non-volatile two-terminal nanotube switches.

FIG. 1A illustrates a cross sectional representation of a nonvolatile 2-terminal nanotube switch (2-TNS) 10. Nanotube element 25 is disposed on substrate 35, which includes a layer of insulator 30. Nanotube element 25 at least partially overlaps two terminals, e.g., conductive elements 15 and 20, which are both deposited directly onto nanotube element 25. In this embodiment, nanotube element 25 is patterned within a region that can be defined before or after deposition of conductive elements 15 and/or 20.

Conductive elements 15 and 20 are in contact with stimulus circuit 50. Stimulus circuit 50 electrically stimulates at least one of conductive elements 15 and 20, which changes the state of switch 10. More specifically, nanotube element 25 responds to the simulation by changing the resistance of switch 10 between conductive elements 15 and 20; the relative value of the resistance corresponds to the state of the switch. For example, if stimulus circuit 50 applies a first electrical stimulus, which may be for example a relatively high voltage and a current across conductive elements 15 and 20, then nanotube element 25 responds by changing the resistance of the device between conductive elements 15 and 20 to a relatively high resistance. This corresponds to an "erased" or "off" state of the device, where electrical conduction is relatively poor between conductive elements 15 and 20. The impedance between elements 15 and 20 may also be relatively high in this state. For example, if stimulus circuit 50 applies a second electrical stimulus, which may be for example a relatively low voltage and a current across conductive elements 15 and 20, then nanotube element 25 responds by changing the resistance of the switch between conductive elements 15 and 20 to a relatively low resistance. This corresponds to a "programmed" or "on" state of the device, where electrical conduction is relatively good, or even near-ohmic, between conductive elements 15 and 20. The impedance between elements 15 and 20 may also be relatively low in this state. The "erase" current associated with the relatively high "erase" voltage may be greater than or less than the "program" current associated with the relatively low "program" voltage. "Erase" and "program" currents are typically in the nano-Ampere or micro-Ampere range, and are determined by geometry and material selection of the nonvolatile two-terminal nanotube switch. In general, the resistance as well as the impedance between the first and second conductive elements of the device is a function of the state of the device, and can be determined by measuring electrical characteristics of the switch.

Conductive elements 15 and 20 are preferably made of a conductive material, and can be the same or different material depending on the desired performance characteristics of switch 10. Conductive elements 15 and 20 can, for example, be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, and semiconductor, materials can also be used. Insulator 30 is preferably a suitable insulative material, for example $SiO_2$, SiN, $Al_2O_3$, BeO, GaAs, polyimide, or other suitable material. Examples of conductive and insulative materials that can be used in 2-TNS 10 are described in greater detail in U.S. patent application Ser. No. 11/280,786, entitled "Two Terminal Nanotube Devices and Systems and Methods of Making Same," filed on an even date herewith.

In some embodiments, nanotube element (article) 25 is a fabric of matted carbon nanotubes (also referred to as a nanofabric). Nanotubes in the nanofabric may be randomly oriented, or may have an orientation that is not constrained to an orientation of nanotube element 25. Nanotube elements generally substantially conform to surfaces; in some embodiments, one or more terminals of a two-terminal nanotube switch have vertically oriented surfaces, and the nanotube element substantially conforms to at least a portion of the vertically oriented surface. In some embodiments, the nanotube element or fabric is porous, and material from conductive elements 15 and/or 20 may fill at least some of the pores in nanotube element 25. In some embodiments, nanotube element 25 includes single-walled nanotubes (SWNTs) and/or multiwalled nanotubes (MWNTs) and/or double-walled nanotubes (DWNTs). In some embodiments, nanotube element 25 includes one or more bundles of nanotubes. Generally, nanotube element 25 includes at least one nanotube. Methods of making nanotube elements and nanofabrics are known and are described in U.S. Pat. Nos. 6,784,028, 6,835,591, 6,574,130, 6,643,165, 6,706,402, 6,919,592, 6,911,682, and 6,924,538; U.S. Patent Publication Nos. 2005-0062035, 2005-0035367, 2005-0036365, and 2004-0181630; and U.S. patent application Ser. Nos. 10/341,005, 10/341,055, 10/341,054, 10/341,130, the contents of which are hereby incorporated by reference in their entireties (hereinafter and hereinbefore the "incorporated patent references"). Some embodiments for nanotube elements that can be used in 2-TNS 10 are described in greater detail in U.S. patent application Ser. No. 11/280,786, entitled "Two Terminal Nanotube Devices and Systems and Methods of Making Same," filed on an even date herewith.

Generally it is preferable that the values of the high and low resistances are separated by at least an order of magnitude. In some preferred embodiments, the "off" state has a resistance that is at least about 10 times higher than a resistance of the "on" state. In some preferred embodiments, the "off" state has an impedance that is at least about 10 times higher than an impedance of the "on" state. In some embodiments, the "programmed" or "on" state is characterized by a resistance ($R_{ON}$) between conductive elements 15 and 20 that is generally in the range of 100 Ohms to 1 M-Ohm. In some embodiments, the "erased" or "off" state is characterized by a resistance ($R_{OFF}$) between conductive elements 15 and 20 that is generally in the range of 10 M-Ohm to 10 G-Ohm or more. The two states are non-volatile, i.e., they do not change until stimulus circuit 50 applies another appropriate electrical stimulus to at least one of conductive elements 15 and 20, and they retain state even if power is removed from the circuit. Stimulus circuit can also determine the state of 2-TNS 10 with a non-destructive read-out operation (NDRO). For example, stimulus circuit 50 may apply a low measurement voltage across conductive elements 15 and 20, and measure the resistance R between the conductive elements. This resistance can be measured by measuring the current flow between conductive elements 15 and 20 and from that calculating the resistance R. The stimulus is sufficiently weak that it does not change the state of the device. Another example of a method of determining the state of the cell by measuring pre-charged bit line capacitance discharge through (between) conductive elements 15 and 20 is described further below. Example electrical stimuli and resistances for "programmed" and "erased" states for some embodiments of two-terminal nanotube switches, and example "read" stimuli, are described in greater detail in U.S. patent application Ser. No. 11/280,786, entitled "Two Terminal Nanotube Devices and Systems and Methods of Making Same," filed on an even date herewith.

Figure 1B:
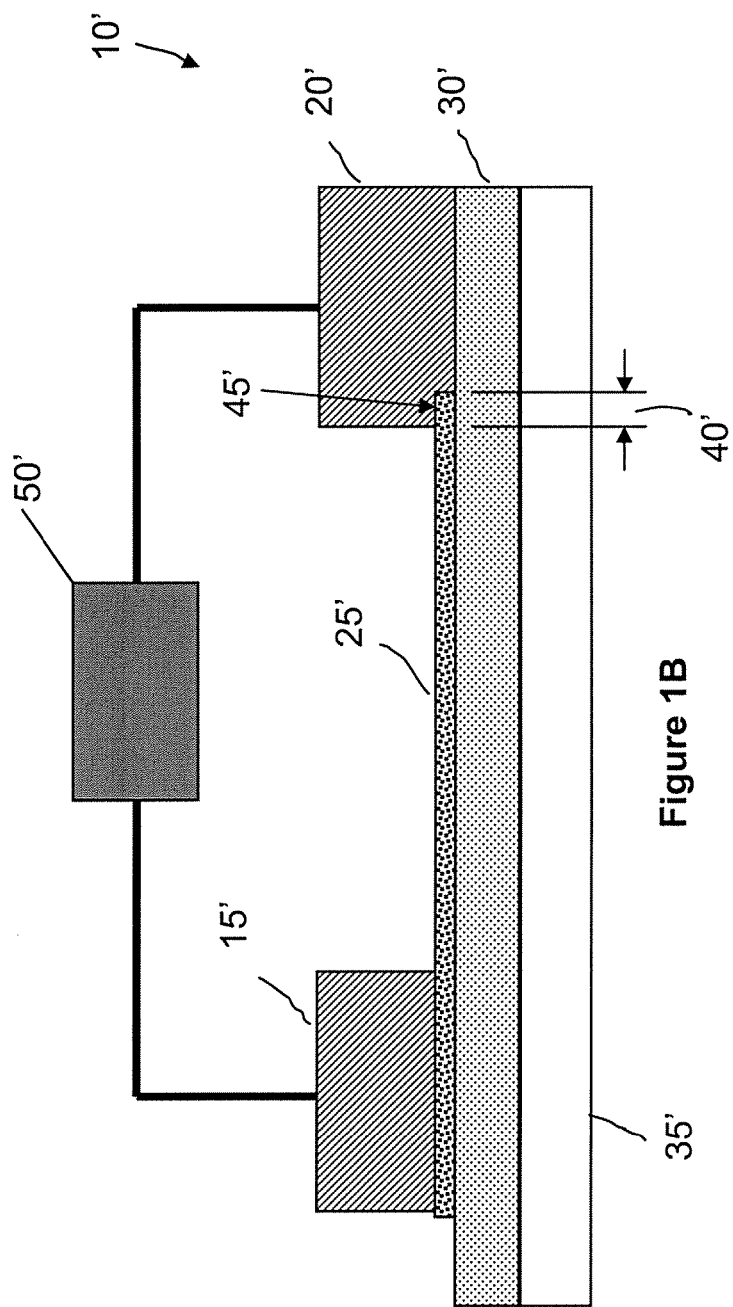

In some embodiments, thermal and/or electrical engineering, that is thermal and/or electrical engineering management (design), can be used to enhance the performance of a two-terminal nanotube switch, as described in U.S. patent application Ser. No. 11/280,786, entitled "Two Terminal Nanotube Devices and Systems and Methods of Making Same," filed on an even date herewith. FIG. 1B illustrates a cross sectional representation of nonvolatile two-terminal nanotube switch (2-TNS) 10', in which thermal and/or electrical engineering management (design) is accomplished by limiting the overlap between nanotube element 25' and conductive element 20'. Nanotube element 25' is disposed on substrate 35', which includes a layer of insulator 30'. Nanotube element 25' is arranged to overlap with a specified geometrical relationship, e.g., by a predetermined extent, at least a portion of at least one of the terminals, e.g., conductive elements 15' and 20', which are both deposited directly onto nanotube element 25'.

In this embodiment, nanotube element 25' is patterned within a region that can be defined before or after deposition of conductive elements 15' and/or 20'. Conductive element 15' overlaps one entire end-region of nanotube element 25', forming a near-ohmic contact. At the opposite end of nanotube element 25', at overlap region 45', conductive element 20' overlaps nanotube element 25' by a controlled overlap length 40'. Controlled overlap length may be for example in the range of 1 to 150 nm, or in the range of 15-50 nm. In one preferred embodiment, controlled overlap length 40' is about 45 nm. The materials and methods of making switch 10' may be similar to those described above for switch 10 of FIG. 1A.

Switches 10 and 10' illustrated in FIGS. 1A and 1B are intended to be illustrative examples of two-terminal nanotube switches that can be used in memory arrays using nanotube articles with reprogrammable resistance. Other embodiments of 2-TNS that can be used in memory arrays are described in U.S. patent application Ser. No. 13/113,398, entitled "Two-Terminal Nanotube Devices And Systems And Methods Of Making Same," filed on an even date herewith and having a common assignee as the present application, the contents of which are incorporated herein in their entirety by reference.

Figure 1D:
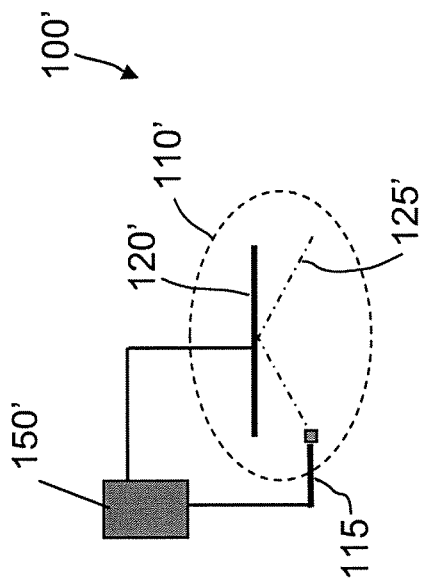
FIG. 1D is a schematic representation of the non-volatile two-terminal nanotube switch of FIG. 1A in a low resistance "on" state according to certain embodiments of the invention.
Figure 1C:
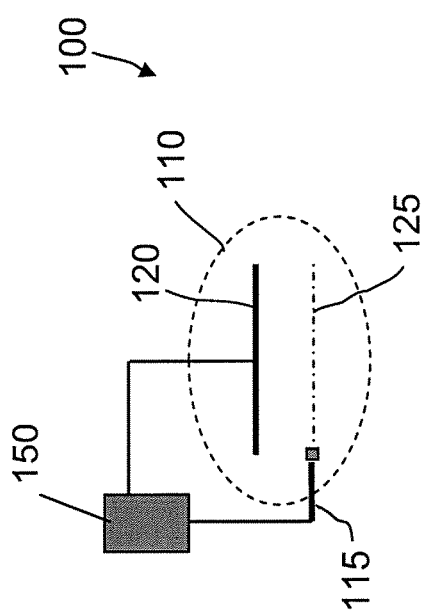
FIG. 1C is a schematic representation of the non-volatile two-terminal nanotube switch of FIG. 1A in a high resistance "off" state according to certain embodiments of the invention.

FIGS. 1C and 1D are schematic illustrations of 2-TNS 10 shown in FIG. 1A, in "off" and "on" states respectively. FIG. 1C illustrates switch 100 in an "off" state 110. Conductive element 120 of FIG. 1C corresponds to conductive element 20 in FIG. 1A, and conductive element 115 corresponds to conductive element 15 in FIG. 1A. Nanotube element 125 corresponds to nanotube element 25 in FIG. 1A. Stimulus circuit 150 applies appropriate electrical stimulation to at least one of elements 115 and 120 to change the state of switch 100 to state 110. State 110 of switch 100 is characterized by a relatively high electrical resistance between elements 115 and 120, which can be considered a "no contact" state because there is relatively poor electrical contact between element 115 and element 120. FIG. 1D illustrates switch 100' in an "on" state 110'. Conductive element 120' of FIG. 1D corresponds to conductive element 20 in FIG. 1A, and conductive element 115 corresponds to conductive element 15 in FIG. 1A. Stimulus circuit 150' applies appropriate electrical stimulation to at least one of elements 115' and 120' to change the state of switch 100' to state 110'. State 110' of switch 100' is characterized by a relatively low resistance, which can be considered a "contact" state because there is relatively good electrical contact between conductive elements 115' and 120'.

Passivation of NRAM devices may be used to facilitate device operation in air, at room temperature, and as a protecting layer in conjunction with stacked material layers on top on the NRAM device. Operation of unpassivated NRAM devices are typically performed in an inert ambient, such as argon, nitrogen, or helium, or an elevated (greater than 125 C) sample temperature to remove adsorbed water from the exposed nanotubes. Therefore, the requirements of a passivation film are typically twofold. First, the passivation should form an effective moisture barrier, preventing exposure of the nanotubes to water. Second, the passivation film should not interfere with the switching mechanism of the NRAM device.

One approach to passivation involves cavities, which have been fabricated around the NRAM devices to provide a sealed switching region. Cavities both around individual devices (device-level passivation) and around an entire die of 22 devices (die-level passivation) have been demonstrated. However, the process flow to fabricate is complicated, with at least 2 additional lithography steps, and at least 2 additional etching steps required.

Another approach to passivation involves depositing a suitable dielectric layer over the NRAM devices. An example of this approach is the use of spin-coated polyvinyledenefluoride (PVDF) in direct contact with the NRAM devices. The PVDF is patterned into either die-level (over an entire die active region) or device-level patches (individual patches covering individual devices). Then a suitable secondary dielectric passivation film, such an alumina or silicon dioxide is used to seal off the PVDF and provide a passivation robust to NRAM operation. It is thought that NRAM operation thermally decomposes the overlying PVDF, hence a secondary passivation film is required to seal off the devices. Since the die level passivations are typically ~100 micron square patches, this local decomposition can lead to ruptures of the secondary passivation, exposure of NRAM devices to air, and their subsequent failure. To avoid such failures of the secondary passivation film, the die-level passivated devices are "burned-in" electrically by pulsing the devices typically with 500 ns pulses from 4V to 8V in 0.5V steps. This is thought to controllably decompose the PVDF and prevent a rupture of the overlying secondary passivation film. After the burn-in procedure the die-level passivated NRAM devices operate normally. Devices passivated with a device-level PVDF coating and a secondary passivation film do not require such a burn in procedure and may be operated in air at room temperature directly at operating voltages. With device-level passivation the PVDF is patterned in the exact shape of the CNT fabric, typically 0.5 microns wide and 1-2 microns long. It is thought that such small patches can decompose without stressing the secondary passivation film to failure. It is possible that for a given defect density in the secondary passivation, there are no defects on average over the smaller footprint of the device-level PVDF patches in comparison to the larger, die-level patches.

The memory arrays described herein include a stimulus/latch circuit that can independently select and control each switch in the array by applying appropriate stimuli to lines that are in electrical contact with the switch, as described in greater detail below. The stimulus/latch circuit also is in communication with a set of storage latches that correspond to switches in the array. The stimulus/latch circuit records states of the nanotube switches in the array into the latches during a read operation.

Memory Arrays Using Two-Terminal Nanotube Switches

Figure 2:
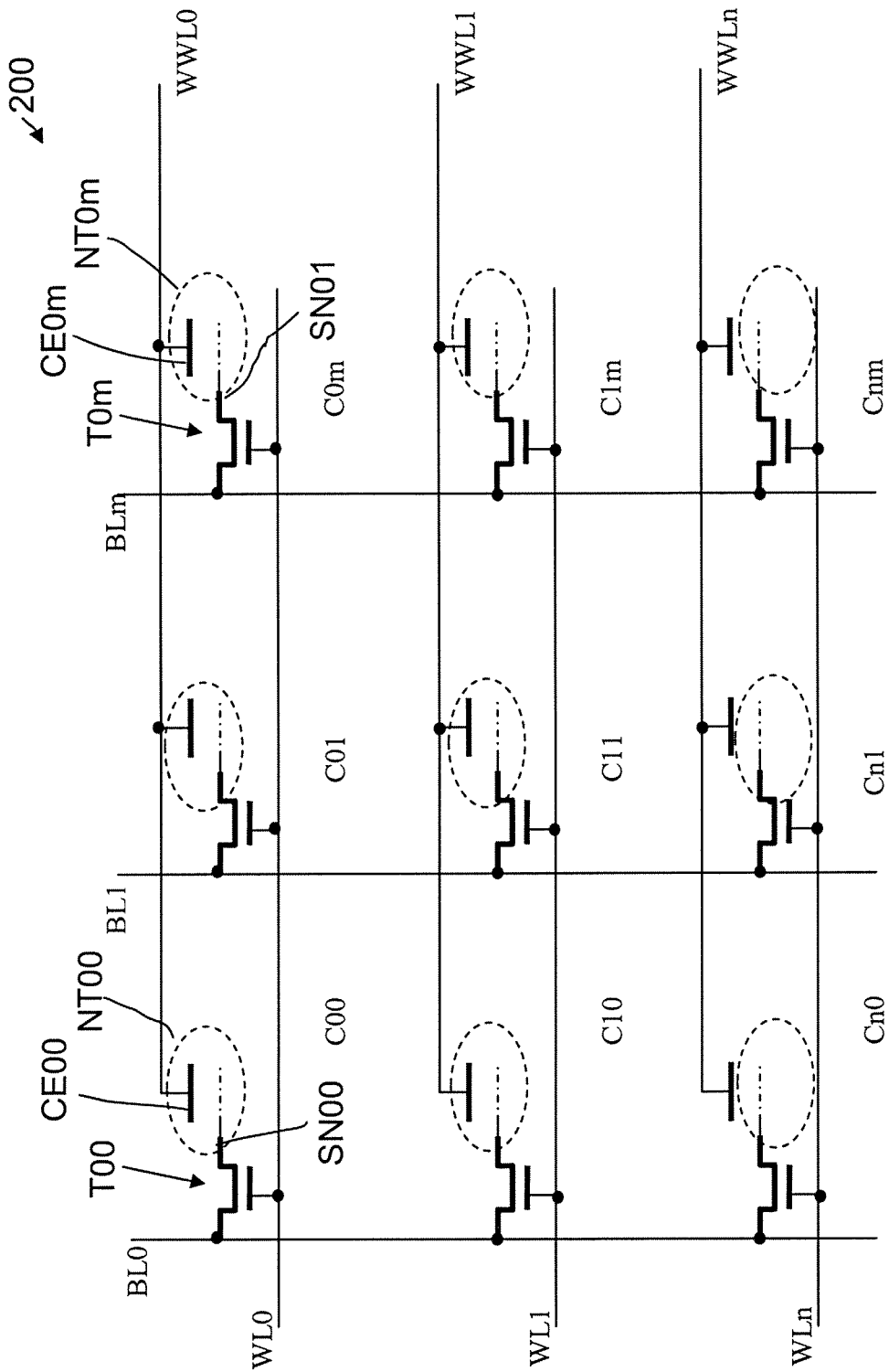
FIG. 2 is an illustration of a memory array with each memory cell including a cell select FET and a non-volatile two-terminal nanotube switch according to certain embodiments of the invention.

One embodiment of a nonvolatile NRAM memory array 200 including non-volatile two-terminal nanotube switches is illustrated in FIG. 2. Array 200 includes NFET or PFET devices, particularly NFET array select devices Txy, where x is a word line index, and y is a bit line index. Txy is in series with nonvolatile two terminal nanotube switch NTxy to provide nonvolatile memory unit cells that may be employed in integrated circuits. Here, nanotube switches NTxy are illustrated schematically and correspond to nanotube switch schematics 100, 100' illustrated in FIGS. 1C and 1D. Select node SNxy corresponds to conductive element 115, 115' illustrated in FIGS. 1C and 1D. Conductive element CExy corresponds to conductive elements 120, 120' illustrated in FIGS. 1C and 1D. Each nonvolatile nanotube switch NTxy in the array can be in one of two states, an "on" state corresponding to state 110' shown in FIG. 1D, and "off" state corresponding to state 110 shown in FIG. 1C and described further above.

Nonvolatile NRAM memory array 200 includes a matrix of nonvolatile storage cells C00 through Cnm. Non-volatile cell C00, as with other cells in the array, includes select transistor T00 and nanotube switch NT00. The gate of T00 is coupled to WL0, the drain of T00 is coupled to BL0, and the source of T00 is coupled to select node SN00, which is in contact with the nanotube element of NT00. Conductive element CE00 is connected to secondary word line WWL0. In another embodiment, the gate of T00 is coupled to BL0, the drain of T00 is coupled to WL0, and the source of T00 is coupled to select node SN00, which is in contact with the nanotube element of NT00.

NRAM memory array 200 also includes word lines (WL0, WL1, to WLn); secondary word lines (WWL0, WWL1, to WLn); and bit lines (BL0, BL1, to BLm). Although it is not illustrated, a stimulus/latch circuit is in electrical contact with the word, secondary word, and bit lines, and through these lines provides erase, write (program), and read signals to the memory cells C00 . . . Cnm. The stimulus/latch circuit may include a signal generator, and each line may be in contact with an independent signal generator or may share a common signal generator.

For an exemplary erase operation along word line WL0, simultaneously erasing cells C00, C01, through cell C0m, the stimulus/latch circuit first reads out and stores in corresponding latches the contents of cells C00 through C0m as illustrated further below. Erase operation along word line WL0 proceeds with all bit lines BL0, BL1, through BLm grounded (at zero volts). All secondary word lines WWL0, WWL1 through WWLn are grounded at the start of the erase operation. The stimulus/latch circuit starts word line WL0 at ground (zero volts) and then applies voltage $V_W$, turning transistor T00 ON and forming a conducting channel that connects select node SN00 to grounded bit line BL0. The FET channel resistance of transistor T00 is designed to be much lower (10 times lower, for example) than the "on" resistance of nanotube switches NT00.

Next, the stimulus/latch circuit applies an erase stimulus $V_E$ to secondary word line WWL0. As described in greater detail in U.S. patent application Ser. No. 13/113,398, entitled "Two Terminal Nanotube Devices and Systems and Methods of Making Same," filed on an even date herewith, an erase stimulus can be, for example, a single pulse or a series of pulses, and may have an appropriate waveform and/or amplitude and/or number of pulses. If, prior to the erase operation, device NT00 is in an "on" state, current flows from secondary word line WWL0 to conductive element CE00, through the nanotubes of nanotube switch NT00, through the channel of transistor T00, to BL0 which is grounded. Most of the voltage drop is across nanotube switch NT00 because transistor T00 channel resistance is much less than nanotube switch NT00 resistance. If, for example, the channel resistance of transistor T00 is 1/10 of nanotube switch NT00, then 0.9 $V_E$ appears across switch NT00. Erase stimulus $V_E$ causes nanotube switch NT00 to change from the low resistance "on" state to high resistance "off" state. If, prior to the erase operation, nanotube switch NT00 is in the "off" state, then nanotube switch NT00 remains in the "off" state. After the erase operation is completed, all nanotube switches NT00 through NT0m are erased and in the high resistance "off" state.

A write (program) operation is preceded by an erase operation as described further above. In other words, cells C00 through C0m along a selected word line WL0 begin the program operation in the erased or "off" state. For an exemplary write (program) operation (to cell C00, for example), secondary word line WWL0 is at ground and WL0 is at ground at the start of the write operation. A stimulus/latch circuit selects transistor T00 by switching word line WL0 from ground to $V_W$. If nanotube switch NT00 in cell C00 is to be programmed from the "off" state to the "on" state (corresponding to a logic "1" state, for example), then the stimulus/latch circuit applies a program stimulus $V_{BP}$ to bit line BL0. As described in greater detail in U.S. patent application Ser. No. 13/113,398, entitled "Two Terminal Nanotube Devices and Systems and Methods of Making Same," filed on an even date herewith, a program stimulus can be, for example, a single pulse or a series of pulses, and may have an appropriate waveform and/or amplitude and/or number of pulses. For example, bit line voltage may first be ramped to $V_{BP}$, and then reduced to ½ $V_{BP}$ to complete the write (programming) operation. In general, program voltage pulses are chosen to maximize program voltage efficiency. Current flows from bit line BL0 through the channel of transistor T00, through the nanotubes of nanotube switch NT00 to conductive element CE00, and to secondary word line WWL0. If, however, nanotube switch NT00 in cell C00 is to be programmed to the "off" state (corresponding to a logic "0" state, for example), then bit line BL0 voltage remains at zero volts, and NT00 in cell C00 remains in the "off" state.

For an exemplary read operation (from cell C00, for example), the stimulus/latch circuit sets secondary word line WWL0 at ground, and drives bit line BL0 voltage high, $V_{BR}$ for example, and allows the voltage on the line to float. Read bit line voltage $V_{BR}$ is selected to be less than both "erase" and "program" voltages to ensure that stored logic states (bits) are not disturbed (changed) during a read operation. The stimulus/latch circuit drives WL0 to a high voltage, $V_{WR}$ for example, turning transistor T00 ON and forming a conducting channel. If NT00 is in an "on" state, then a conductive path is formed between bit line BL0 and WWL0, through transistor T00 channel and the nanotubes of nanotube switch NT00. This allows the floating voltage on bit line BL0 to discharge to ground. If, however, nanotube switch NT00 is in an "off" state, then no conductive path is formed between bit line BL0 and WWL0. This prevents bit line BL0 from discharging to ground, so it remains at $V_{BR}$. The stimulus/latch circuit (not shown) detects changes in the voltage on pre-charged bit line BL0. If the stimulus/latch circuit detects that bit line BL0 voltage has decreased by more than a predetermined amount that exceeds a predetermined sensing threshold value $\Delta V_{BR}$, eg., that NT00 is in an "on" state, the stimulus/latch circuit sets a latch corresponding to memory cell C00 to a logic "1" state. The actual value of the predetermined sensing threshold value $\Delta V_{BR}$ depends upon specific parameters cell of NT00, and may be determined either empirically or analytically through techniques known in the art. If the stimulus/latch circuit detects that bit line BL0 pre-charge voltage $V_{BR}$ is unchanged, e.g., that NT00 is in an "off" state, then the stimulus/latch circuit sets a latch corresponding to NT00 to a logic "0" state. The read operation is therefore a nondestructive read out (NDRO) of the cell information. No write back/regeneration cycle is necessary. Also, if external power is lost (or turned-off), the array preserves the stored information (i.e., nonvolatile storage).

Operational Waveforms for Memory Arrays Using Two Terminal Nanotube Switches

Figure 3:
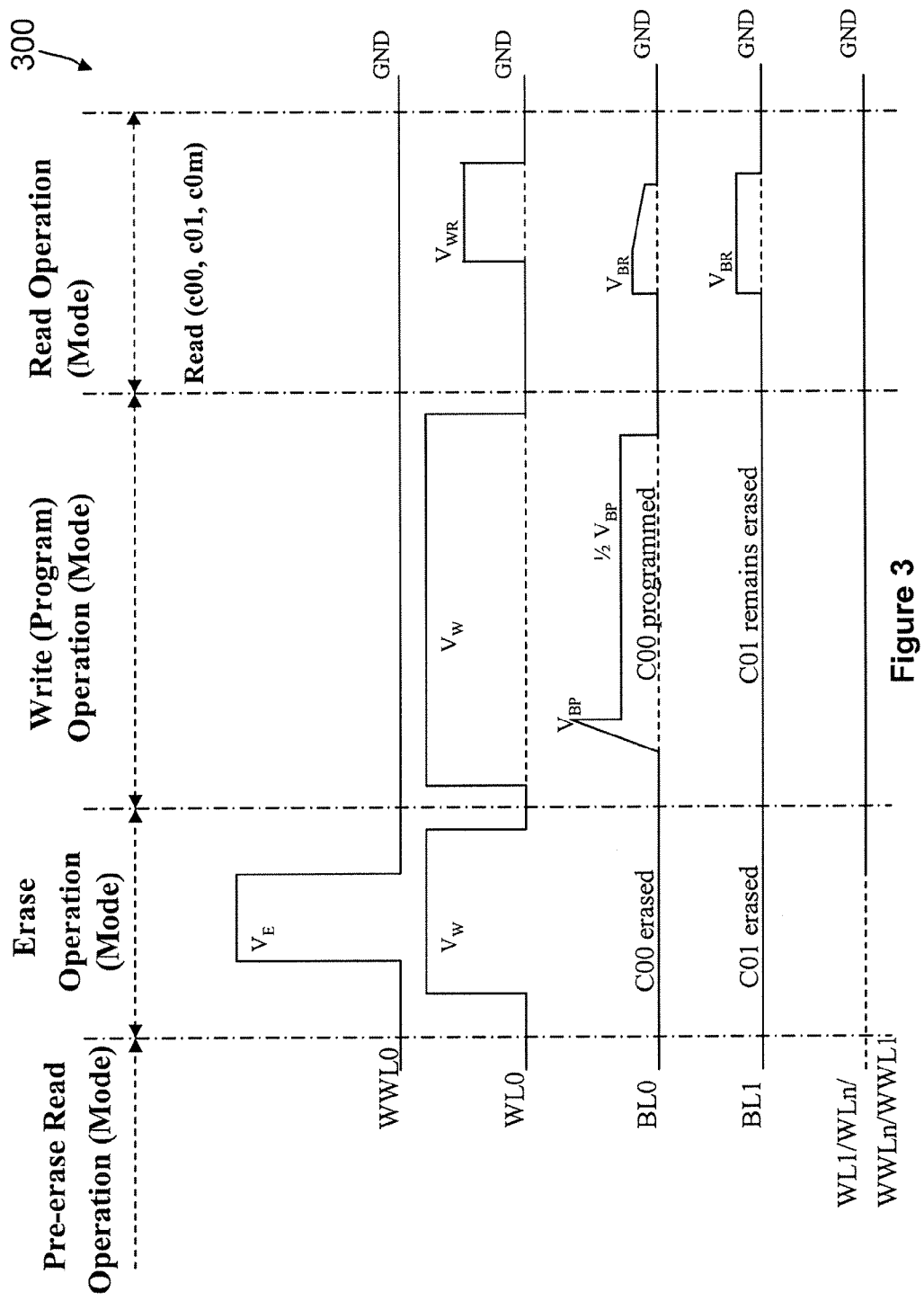
FIG. 3 is an illustration of operational waveforms of a memory array according to certain embodiments of the invention.

FIG. 3 illustrates example operational waveforms 300 that can be applied to the embodiment of a memory array shown in FIG. 2 during erase, program, and read operations (or modes). A pre-erase read operation is performed before the erase operation in order to record cell states along a selected word line, such as word line WL0, in corresponding latches. For both pre-read (not shown) and read (shown) operations, a stimulus/latch circuit pre-charges bit lines BL0 through BL0m to a read voltage $V_{BR}$, for example in the range of 0.5 to 2 volts, and allows the voltage to float. Then, the stimulus/latch circuit changes WL0 from a ground voltage to a read voltage $V_{WR}$, for example of 1 to 6 volts, which is sufficient to turn transistors T00 through T0m ON, e.g., to select cells C00 through C0m for a read operation. In the example shown in FIG. 3, during the read operation cell C00 is in an "on" (logic "1") state (illustrated in FIG. 1D) and cell C01 is in an "off" (logic "0") state (illustrated in FIG. 1C). For cell C00, the BL0 read voltage $V_{BR}$ decreases because bit line BL0 capacitance discharges to ground as shown in FIG. 3. The difference in BL0 read voltage $\Delta V_{BR}$ between "on" and "off" states is typically about in the 100 mV to 200 mV range, although this value may vary depending upon the particular characteristics of the circuit. The stimulus/latch circuit (not shown) determines that the BL0 voltage has changed for C00, and latches a logic "1" state corresponding to the "on" state of NT01 in cell C00. For cell C01, the stimulus/latch circuit determines that the BL1 read voltage has not changed (bit line BL0 has not discharged), and latches a logic "0" state corresponding to the "off" state of NT01 in cell C01.

An erase operation is preceded by a read operation that stores, in latches, the states of the cells to be erased, as described further above. Then, nanotube switches NT00 through NT0m in cells C00 through C0m along word line WL0 are erased simultaneously. At the beginning of an erase operation, WWL0, WL0, and BL0 through BLm are all at ground (zero volts) as shown in FIG. 3. BL0 through BLm remain at ground during the entire erase operation. Stimulus/latch circuit switches word line WL0 voltage to $V_W$, approximately 6 volts for example. This switches transistor T00 of cell C00 ON, and select node SN00 is grounded through the transistor T00 channel. Next, WWL0 is ramped to erase voltage $V_E$. In one embodiment, $V_E$ is approximately 10 volts for example. If nanotube switch NT00 is in the high resistance "off" state at the beginning of the erase operation, it remains in the "off" state after completion of the erase operation. If, prior to the erase operation, nanotube switch NT00 is in the "on" state, then current flows and nanotube switch NT00 changes from the "on" state to the "off" state. Current flows between WWL0 and BL0 with a current in the range, for example, of 100 nA to 100 uA, depending on the characteristics of switch NT00, for example the number or density and resistance of nanotubes in the nanotube element of the switch.

Nanotube switch NT00 "on" state resistance is typically 10 times higher than transistor T00 channel resistance, so for an example erase voltage $V_E$ of approximately 10 volts, select node SN00 is at approximately 1 volt, and transistor T00 experiences a gate-to-source voltage difference of approximately 5 volts, and a gate-to-drain voltage difference of approximately 6 volts. In general, it should be noted that although $V_E$ is illustrated in FIG. 3 as a square pulse, a single or series of WWL0 erase pulses having appropriate amplitudes and waveforms may be applied, as described in greater detail in U.S. patent application Ser. No. 13/113,398, entitled "Two Terminal Nanotube Devices and Systems and Methods of Making Same," filed on an even date herewith.

A write (program) operation is preceded by an erase operation, as described above, that erases all nanotube switches along a selected word line. For example if word line WL0 is selected, nanotube switches NT00 through NT0m are erased. Thus, all nanotube switches NT00 through NT0m are in the erased "off" high resistance state at the beginning of the write operation. At the beginning of the write operation, WWL0 through WWLn, WL0 through WLn, and BL0 through BLm are all at ground (zero volts). In this example, nanotube switch NT00 in cell C00 is to be switched (e.g., written, programmed) to an "on" (logic "1") state, and nanotube switch NT01 in cell C01 is to be left in an "off" (logic "0") state. WWL0 remains at ground during the entire write operation. Stimulus/latch circuit applies a voltage $V_W$ to word line, approximately 6 volts for example. Transistor T00 turns ON, and select node SN00 is electrically connected to bit line BL0 through the transistor T00 channel. Since in this example cell C00 nanotube switch NT00 is to be switched from the "off" state to the "on" state, then stimulus circuit ramps BL0 to program voltage $V_{BP}$, approximately 5-6 volts for example. BL0 write voltage $V_{BP}$ is transmitted through transistor T00 to select node SN00. Transistor T00 operates in the source-follower mode, such that the source voltage of transistor T00 (connected to select node SN00) equals $V_{BP}$ minus the transistor T00 source-follower threshold voltage drop of approximately 1-1.5 volts, for example. Therefore, a select node SN00 write voltage of, for example, approximately 4.5 volts is applied across nanotube switch NT00 (between select node SN00 and conductive element CE00 connected to secondary word line WWL0). Note that the source-follower operating mode is well known in the industry. Write current flows through transistor T00 and the nanotube element of nanotube switch NT00, and nanotube switch NT00 transitions from the "off" state to the "on" state. Current flows between BL0 and WWL0, with current in the range of, for example, 100 nA to 100 uA, depending on the characteristics of nanotube switch NT00.

It should be noted that the bit line write voltage may be changed during the write operation. In one example shown in FIG. 3, the bit line write voltage may be changed from $V_{BP}$ to ½ $V_{BP}$ during the write operation. Thus, for example, the bit line write voltage may transition from a $V_{BP}$ of, for example, approximately 5-6 volts to a ½ $V_{BP}$ of, for example, approximately 2.5-3 volts, with corresponding select node SN00 transitioning from, for example, approximately 4.5 volts to 1.5-2 volts during the write operation. Since in this example cell C01 is to remain in the "off" state, then nanotube switch NT01 is to remain in the high resistance "off" state, bit line BL1 voltage remains at ground (zero) during the write cycle as shown in FIG. 3, and switch NT01 remains in the "off" state. Bit lines BL2 through BLm will provide write voltages or remain at ground, as illustrated by bit lines BL0 and BL1, depending on the logic state to be written in the corresponding cells of array 200.

The following U.S. patent applications and issued patents disclose various methods and techniques for making nanotube fabrics and nanotube elements that may be included in preferred embodiments. In some embodiments the nanotube elements are porous and in some instances highly porous. In one or more embodiments the nanotube elements are substantially a monolayer of carbon nanotubes. In some embodiments, the nanotube elements include single-walled carbon nanotubes, multi-walled nanotubes, and/or double-walled nanotubes. In some embodiments the nanotube elements include one or more bundles of nanotubes. The following references are assigned to the assignee of this application and are hereby incorporated by reference herein in their entirety:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Three-Trace Junction Devices (U.S. patent application Ser. No. 10/033,323, now U.S. Pat. No. 6,911,682), filed on Dec. 28, 2001;

Nanotube Films and Articles (U.S. patent application Ser. No. 10/128,118, now U.S. Pat. No. 6,706,402), filed on Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Non-volatile Electromechanical Field Effect Devices and Circuits using Same and Methods of Forming Same (U.S. patent application Ser. No. 10/864,186), filed Jun. 9, 2004;

Devices Having Horizontally-Disposed Nanofabric Articles and Methods of Making the Same, (U.S. patent application Ser. No. 10/776,059, U.S. Patent Publication No. 2004/0181630), filed Feb. 11, 2004;

Devices Having Vertically-Disposed Nanofabric Articles and Methods of Making the Same (U.S. patent application Ser. No. 10/776,572, U.S. Patent Publication No. 2004/0175856), filed Feb. 11, 2004; and Patterned Nanoscopic Articles and Methods of Making the Same (U.S. patent application Ser. No. 10/936,119, U.S. Patent Publication No. 2005/0128788).

The invention may be embodied in other specific forms without departing from the spirit or essential characteristics thereof. The present embodiments are therefore to be considered in respects as illustrative and not restrictive.

What is claimed is:

1. A method of operating a two terminal nanotube memory cell comprising:
   applying a first electrical stimulus between a first terminal and a second terminal, so as to change the resistance of a nanotube article between the first terminal and the second terminal to a relatively high resistance; and
   applying a second electrical stimulus between the first terminal and the second terminal, so as to change the resistance of the nanotube article between the first and second terminals to a relatively low resistance,
   wherein a relatively high resistance of the nanotube article corresponds to a first informational state of the memory cell, and wherein a relatively low resistance of the nanotube article corresponds to a second informational state of the memory cell; and
   wherein the nanotube article is in permanent electrical communication with the first terminal and the second terminal.

2. The method of claim 1, wherein the first and second informational states are nonvolatile.

3. The method of claim 1, wherein the resistance of the first state is at least about ten times larger than the resistance of the second state.

4. The method of claim 1, wherein the nanotube article comprises a region of nanotube fabric of defined orientation.

5. The method of claim 1, wherein the first and second terminals comprise metal.

6. The method of claim 5, wherein the metal comprises at least one Ru, Ti, Cr, Al, Au, Pd, Ni, W, Cu, Mo, Ag, In, Ir, Pb, Sn, TiAu, TiCu, TiPd, PbIn, and TiW.

7. The method of claim 1, wherein the two terminal memory cell receives a bit line, a first word line, and a second word line.

8. The method of claim 7 comprising:
   applying a select voltage to the first word line to select the cell and program voltage to the bit line to change the resistance of the nanotube article to a relatively low resistance.

9. The method of claim 7 comprising:
   applying a select voltage to the first word line to select the cell; and
   applying an erase voltage to the bit line to change the resistance of the nanotube article to a relatively high resistance value.

10. The method of claim 7 comprising:
    reading an informational state of the memory cell.

11. The method of claim 10 wherein reading the informational state of the memory cell comprises:
    selecting the cell by activating one of the bit line and the first word line; and
    applying a read stimulus to the bit line.

12. The method of claim 11 wherein applying a read stimulus to the bit line comprises:
    applying a floating voltage; and
    determining whether the voltage on the bit line decays below a threshold value.

13. The method of claim 1, comprising producing an erase operation for the first electrical stimulus.

14. The method of claim 13, wherein producing an erase operation comprises applying one or more voltage pulses, wherein an amplitude of the pulses, a waveform of the pulses, and a number of the pulses together are sufficient to change the memory cell to the first informational state.

15. The method of claim 1, producing a program operation for the second electrical stimulus.

16. The method of claim 15, wherein producing the program operation comprises applying one or more voltage pulses, wherein an amplitude of the pulses, a waveform of the pulses, and a number of the pulses together are sufficient to change the device to the second informational state.

17. The method of claim 7, comprising:
    applying a select voltage to the first word line to select the cell; and
    applying an erase voltage to the second word line to change the resistance of the nanotube article to a relatively high resistance.

18. The method of claim 7 comprising:
    applying a select voltage to the first word line to select the cell; and
    applying a program voltage to the second word line to change the resistance of the nanotube article to a relatively low resistance.

* * * * *